United States Patent [19]
Linn et al.

[11] Patent Number: 5,932,022
[45] Date of Patent: Aug. 3, 1999

[54] SC-2 BASED PRE-THERMAL TREATMENT WAFER CLEANING PROCESS

[75] Inventors: Jack H. Linn, Melbourne; George V. Rouse, Indialantic; Sana Rafie, Melbourne; Roberta R. Nolan-Lobmeyer; Diana Lynn Hackenberg, both of West Melbourne; Steven T. Slasor, Palm Bay; Timothy A. Valade, Melbourne, all of Fla.

[73] Assignee: Harris Corporation, Melbourne, Fla.

[21] Appl. No.: 09/064,029

[22] Filed: Apr. 21, 1998

[51] Int. Cl.$^6$ ............... B08B 3/12; C23G 1/02; H01L 21/02

[52] U.S. Cl. ............... 134/2; 134/3; 437/235; 438/756

[58] Field of Search ............... 134/3, 2; 437/235; 438/756

[56] References Cited

U.S. PATENT DOCUMENTS

| | | | |
|---|---|---|---|
| 5,238,500 | 8/1993 | Bergman | 134/3 |
| 5,486,266 | 1/1996 | Tsai et al. | 156/657.1 |
| 5,516,730 | 5/1996 | Saeed et al. | 437/235 |
| 5,681,397 | 10/1997 | Li | 134/2 |
| 5,681,398 | 10/1997 | Muraoka | 134/3 |

*Primary Examiner*—Jill Warden
*Assistant Examiner*—Yolanda E. Wilkins
*Attorney, Agent, or Firm*—Charles E. Wands

[57] ABSTRACT

Pre heat-treatment processing of a silicon wafer to grow a hydrophilic oxide layer includes an initial step of contacting the wafer with a pre-clean SC-1 bath, thereby producing a silicon wafer surface that is highly particle free. After a deionized water rinse, the wafer is scoured with an aqueous solution containing hydrofluoric acid and hydrochloric acid to remove metallic-containing oxide from the wafer surface. In order to grow a hydrophilic oxide layer, an SC-2 bath (containing hydrogen peroxide and a dilute concentration of metal-scouring HCl) is used. The resulting hydrophilic silicon oxide layer grown on the surface of the silicon wafer using the combined SC-1→HF/HCL→SC-2 wafer cleaning process has a metal concentration no greater than $1\times10^9$. The diffusion length of minority carriers is increased from a range on the order of 500–600 microns to a range on the order of 800–900 microns.

3 Claims, 1 Drawing Sheet

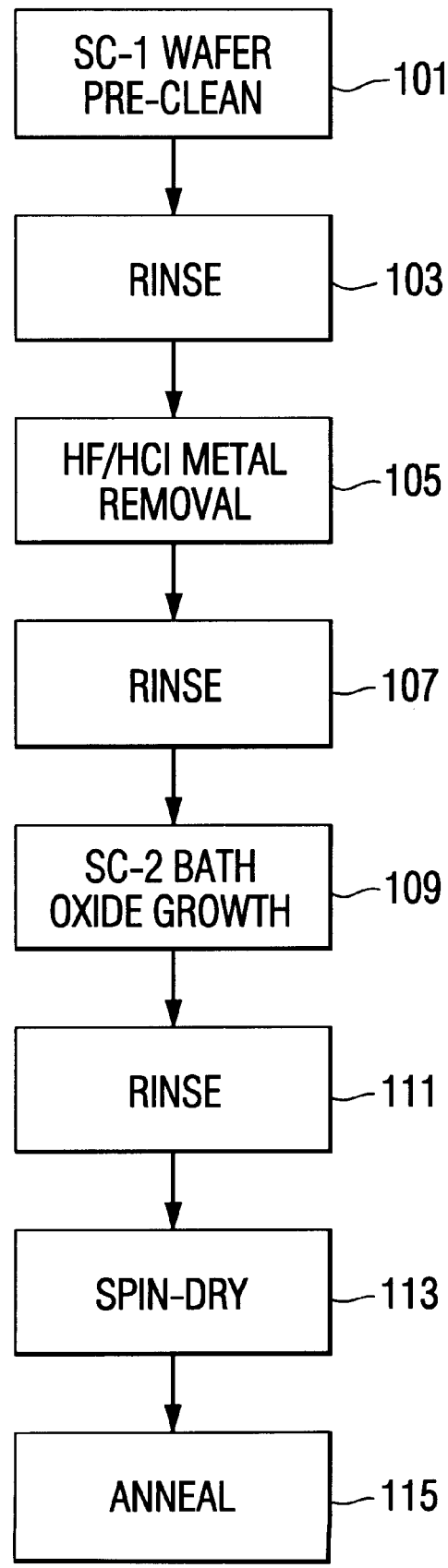

SC-2 BASED PRE-THERMAL TREATMENT WAFER CLEANING PROCESS

FIELD OF THE INVENTION

The present invention relates in general to the manufacture of semiconductors, and is particularly directed to a new and improved process for cleaning silicon wafers prior to a heat treatment, so as to minimize the presence of particulates, organics and metallic contaminants that impact minority carrier recombination lifetimes.

BACKGROUND OF THE INVENTION

The production of single crystal silicon wafers customarily involves growing a single crystal ingot, slicing the ingot into wafers, and then lapping, etching and polishing the wafers. Based upon the required specifications of a circuit device manufacturer, the silicon wafers may also be subjected to thermal processing, such as, but not limited to, oxygen donor annihilation annealing, thermal processing to control oxygen precipitation, low temperature chemical vapor deposition (CVD) oxidation, epitaxial deposition, and polysilicon deposition.

In the course of such thermal processing, a silicon wafer will typically be exposed to a temperature of at least about 300° C. for a duration of at least about one second. Under these conditions, (contaminant) metals that may be present on the surface of the wafer, such as but not limited to nickel, copper, iron, chromium, calcium, titanium, cobalt, manganese, zinc and vanadium, can be driven into the silicon crystal material, where they can degrade bulk silicon minority carrier recombination lifetime. Ideally, the silicon wafer should be metal-free when subjected to thermal processing.

In many applications it is also preferred that silicon wafers to be subjected to thermal processing be passivated by a hydrophilic silicon oxide layer. Unfortunately, a number of limitations associated with conventional processes for growing hydrophilic surface layers of silicon oxide have made it impractical to grow such a silicon oxide layer at a surface concentration of less than $1 \times 10^{11}$ atoms/cm$^2$ of contaminant metals (minority carrier recombination lifetime killers). As a result, silicon wafers have been routinely stripped of their surface oxide layers prior to thermal processing. Unfortunately, stripping such oxide layers prior to thermal processing is not without its disadvantages, as silicon wafers that have a hydrophobic surface layer can be prone to localized (metal) contamination.

A proposal to solve this problem, described in the Pirooz et al. U.S. Pat. No. 5,516,730, is to initially immerse the wafer in a conventional pre-clean SC-1 aqueous cleaning solution containing $H_2O_2$ and $NH_4OH$, in order to remove organic contaminants and particulates, and to form soluble complexes of contaminant metals such as iron, copper, gold, nickel, cobalt, zinc and calcium. To remove the complexed metals, the surface of the pre-cleaned silicon wafer is subjected to the flow of an aqueous solution hydrofluoric (HF) acid (which contains hydrochloric (HCl) acid to enhance metal removal), followed by rinsing the HF and HCl acid-treated wafer in deionized water. In order to grow a hydrophilic oxide layer on its surface, the rinsed wafer is then contacted with ozonated water. The ozonated water-treated wafer upon which the oxide layer has been grown is then heated to a temperature of at least about 300° C. for a duration of at least about one second.

Now although the patentee states that the concentration of contaminant metals on the surface of the oxide-grown wafer at the beginning of the anneal/heating step is less than $1 \times 10^9$ atoms/cm$^2$, his use of ozonated water creates several problems that are antithetical to the objective of forming a hydrophilic oxide on the metal free surface of a silicon wafer. First of all, during the production of ozone in present day commercially available ozone generation equipment, contaminant metals may be leached from the hardware into the ozonated water. Thus, irrespective of how well cleaned the surface of the silicon wafer is following the post HF and HCl acid-treatment (deionized water) rinse, the silicon wafer surface may be exposed to minority carrier recombination lifetime killer contaminants in the ozonated water.

Secondly, ozone concentration in the produced solution is extremely difficult to control. As a result, the degree to which the ozone (which tends to be an extremely aggressive solution with respect to the surface of the silicon wafer) may modify the surface of the wafer can vary. Consequently, it may be expected that the silicon wafer surface will have a texture that may readily trap contaminant metals that are likely to be present in the ozonated water. When the oxide layer begins to grow, these minority carrier recombination lifetime killer metals become fixed or trapped on the wafer surface, and are eventually driven into the bulk silicon material during subsequent thermal processing.

SUMMARY OF THE INVENTION

In accordance with the present invention, the above-described metal decontamination problem is successfully remedied by avoiding the use of ozone and instead, growing the hydrophilic oxide layer in an SC-2 bath (a hydrogen peroxide solution that also contains a dilute concentration of metal-scouring HCl). An HF/HCl bath immersion is used subsequent to the initial SC-1 clean, in order to etch away or purge chemical oxide metallics that may have grown on the wafer surface during the SC-1 cleaning step, thereby producing a silicon wafer surface that is highly hydrophobic and metal-free.

The HCl in the SC-2 bath serves to mitigate metallic contamination during the chemical oxide growth caused by the $H_2O_2$ in the SC-2 bath. The SC-2 medium in which the oxide is grown is not itself a source of metallic contaminants. The resulting hydrophilic silicon oxide layer grown on the surface of the silicon wafer using the combined SC-1→HF/HCL→SC-2 wafer cleaning process of the invention has a metal concentration no greater than $1 \times 10^9$ atoms cm$^{-2}$. Measurements have revealed that subsequent to the heat treatment, the diffusion length of minority carriers is increased from a range on the order of 500–600 microns to a range on the order of 800–900 microns, or about a fifty percent improvement in P-type silicon.

BRIEF DESCRIPTION OF THE DRAWINGS

The single FIGURE shows successive steps of a pre-heat treatment and thermal processing flow sequence in accordance with an embodiment of the present invention.

DETAILED DESCRIPTION

As described above preliminary steps of the pre-heat treatment process according to the present invention are essentially the same as those described in the above-referenced Pirooz patent, and are included within the process flow sequence diagrammatically illustrated in FIG. 1. In accordance with a preferred, but non-limiting example, the steps of the pre-heat treatment cleaning sequence (shown in steps 101–113) may be carried out in a conventional wet bench cleaning apparatus having a series of tanks containing approximately one to one hundred liters of pre-heat treatment solution. In addition, the process is preferably controlled such that a wafer cassette or cassettes holding a plurality of wafers, e.g., up to one hundred wafers, is automatically transported to and immersed in the pre-cleaning bath, oxide growth solution, etc. All wetted parts may be constructed of quartz, polyvinylchloride (PVC), polyvinylidinedfluoride (PVDF), polypropylene, or teflon.

Referring now to the process flow of FIG. 1, at step 101, the silicon wafers are immersed in any of a number of conventionally employed cleaning solutions, including piranha mixtures (mixtures of sulfuric acid and hydrogen peroxide), HF mixtures and SC-1 mixtures. The SC-1 cleaning solution contain may contain about 1000:1:1 to 1:1:1 parts by volume $H_2O:H_2O_2:NH_4OH$, preferably about 100:1:1 to about 5:1:1 parts by volume $H_2O:H_2O_2:NH_4OH$, (which may be supplied as 30–35 wt % $H_2O_2$ in water and 28–30 wt % $NH_4OH$ in water), and having a temperature on the order of about 0° C. to about 100° C., preferably about 250° C., to 90° C. As described above, the SC-1 solution is effective to remove particulates and organic contaminants by the solvating action of ammonium hydroxide and the vigorous action of hydrogen peroxide. Following the SC-1 step 101, the wafers are rinsed with ultra pure water in step 103.

Metal removal is effected in step 105 by immersing the silicon wafers in an HF/HCl aqueous solution, which effectively removes metallic-containing oxids. The HF/HCl serves to tie up such metals—forming soluble metal complexes—so as to inhibit their redeposition from the solution and leaving the wafer surface hydrophobic. For this purpose, the HF/HCl aqueous solution may contain from about 1:1 to about 1:10,000 parts by volume of $HF:H_2O$, (which may be supplied as 49 wt % HF in water). To enhance metals removal, the solution additionally contains HCl (1:1:0 to 1:1:10,000 parts by volume $HF:HCl:H_2O$, (which may be supplied as 36.5–38 wt % HCl in water).

A preferred volumetric range of this aqueous HF/HCl metals removal solution is about 5:2:200 parts by volume of $HF:HCl:H_2O$, (supplied as 49 wt % HF in water), and 36.5–38 wt % HCl in water). The temperature of the solution may be in a range of from about 10° C. to about 90° C., preferably in a range of from about 25° C. to about 60° C. The duration of immersion may be at least about six seconds, and preferably in a range on the order of thirty seconds to ten minutes.

Following metals removal, the wafers are rinsed in step 107 by a deionized water flow for a period of at least about 0.1 minutes and typically about two to ten minutes. The deionized rinse water may have a resistivity from about 3 to about 18 megohms, and preferably greater than about 17 megohms.

After rinsing away the metal-scouring HF/HCl solution in step 107, an oxide layer is grown on the silicon wafers in step 109 by contacting the silicon wafers with an SC-2 bath that contains a hydrogen peroxide solution and a dilute concentration of metal-scouring HCl. The $HCl/H_2O_2$ oxide growth SC-2 solution may comprise HCl (1:0 to 1:10,000 parts by volume $HCl:H_2O$, (which may be supplied as 36.5–38 wt % HCl in water), $H_2O_2$ (1:1:0 to 1:1:10,000 parts by volume $HCl:H_2O_2:H_2O$, supplied as 30–35 wt % $H_2O_2$ in water). A preferred volumetric range of this oxide growth solution is about 1:1:5 parts by volume of $HCl:H_2O_2:H_2O$, (supplied as 30–35 wt % $H_2O_2$ in water), and 36.5–38 wt % HCl in water). The temperature of the oxide growth solution may be in a range of from about 10° C. to about 90° C., preferably in a range of from about 20° C. to about 60° C. The duration of immersion may be at least about six seconds, and preferably in a range on the order of two to ten minutes. The resulting silicon oxide layer may have a thickness on the order of about 0.6 to about 2.5 nanometers.

As described briefly above, the HF/HCl solution serves to remove metallic-containing oxides that may have grown on the wafer surface during the initial pre-clean SC-1 bath of step 101, thereby producing a silicon wafer surface that is highly hydrophobic and metal-free. The SC-2 soltion is not a source of metallic contaminants. The silicon oxide layer grown within the aqueous $HCl:H_2O_2$ bath employed in step 109 has a metal concentration that is considerably reduced compared to that of conventional processes, particularly the ozone-based process described in the Pirooz patent. Measurements have shown that the metal concentration in an oxide formed by the process of the present invention is no greater than $1 \times 10^9$ atoms $cm^{-2}$.

Upon completion of oxide growth step 109, the wafers are rinsed in step 111 for a period of at least about 0.1 minutes, and typically about two to ten minutes in deionized water having a resistivity of about 3 to about 18 megohms, preferably greater than about 17 megohms. After this post oxide growth rinse, the oxided wafers are dried in step 113, by using any drying method which does not recontaminate the wafers with metals or other contaminants. As non-limiting examples, such a non-contaminating drying method may include conventional spin-drying and isopropyl alcohol vapor drying techniques.

Upon completion of the pre-heat treatment sequence of steps 101–113, described above, the dried wafers are transferred to a furnace, rapid thermal annealer or other apparatus, in which thermal processing is to be performed, as shown in step 115. To minimize unnecessary handling (and potential recontamination) and facilitate processing, the drying station of the pre-heat treatment cleaning process is preferably integrated with the thermal processing apparatus.

As described earlier, it is customary practice to subject silicon wafers to oxygen donor annihilation annealing, thermal processes to control oxygen precipitation, low temperature chemical vapor deposition (CVD) oxidation and nitridation, polysilicon deposition and other thermal process steps prior to being polished. As a result of the pre-heat treatment steps of the invention, the wafers upon which such thermal processing operations are carried out have a relatively metal-free, hydrophilic surface, so that the finally processed wafers have a minority carrier diffusion length that is increased considerably compared to wafers obtained using conventional processing, as described above.

While silicon is hydrophobic, silicon oxide is hydrophilic and easily wetted by water. The degree of hydrophilicity or hydrophobicity can be readily determined by reference to the contact angle of a droplet of water placed on the surface. A surface is considered to be hydrophilic if the contact angle is less than 30 degrees; the surface is considered to be hydrophobic if the contact angle is greater than 30 degrees. Preferably, the contact angle for the hydrophilic surfaces described herein is less than 10 degrees and preferably, about three to about five degrees.

Due to the analytical approach used to determine the concentration of metals on the surface of a hydrophilic wafer, the concentrations given here include quantities of metal located on the surface of the silicon dioxide layer, metal incorporated in the silicon dioxide layer, and metal located at the silicon dioxide/silicon interface. Such methods for determining the surface contamination of silicon are conventional. For example, the surface metal content of silicon may be determined as described in an article by K. Ruth et al, Proceedings of the ECS Fall Meeting, Electrochemical Society 1993 (Vol. II) p. 488, the disclosure of which is incorporated herein.

Various techniques may be employed to measure the minority carrier recombination lifetime (or minority carrier diffusion length) of a silicon wafer and typically involve injecting carriers into a wafer sample by means of a flash of light or voltage pulses and observing their decay. A non-limiting example of a process for measuring minority carrier recombination lifetime is the surface photovoltage (SPV) technique described in an article by Zoth et al, in the Journal of Applied Physics, Vol. 67, 6764 (1990). Another scheme for measuring diffusion length is to use an electrolytic metal analysis tool (ELYMAT) instrument, such as that manufactured by GeMeTec, Munich, Germany. This tool measures (to a resolution of about 1 mm) photocurrents generated by a scanning laser beam. Minority carrier diffusion lengths are calculated from these data and diffusion length images can be generated. For a description of this process attention may be directed to an article by H. Foell, Proc. ESSDERC Conference, p. 44, Berlin, Germany, 1989. The calculated diffusion length values are readily converted to minority carrier recombination lifetime values using known formulas.

The following example illustrates the invention.

EXAMPLE

A cleaning process was carried out on smooth P- type silicon wafers having a resistivity of 5–20 ohm-cm, using a conventional wet bench cleaning apparatus. The cleaning sequence for one set of the wafers (set "A" ) was as follows:

STEP 1: 10 minutes in an SC-1 bath (1:1:5 $NH_4O:H_2O_2:H_2O$) with megasonics at 50° C.;

STEP 2: Ultra pure water rinse for 5 minutes;

STEP 3: 1 minute in a metallic-containing oxide removal solution (5:2:200 $HF:HCl:H_2O$);

STEP 4: Overflow deionized water rinse for 5 minutes;

STEP 5: Immersion in an SC-2 bath (1:1:5 $HCl:H_2O_2:H_2O$) for 5 minutes;

STEP 6: Ultra pure water ines for 5 minutes;

STEP 7: Spin dried for 10 minutes; and

STEP 8: Processed through a diffusion furnace (600° C. for 60 minutes) in a nitrogen atmosphere.

A second set of wafers (set 'B" ) was subjected to steps 1–2 and 5–8.

The wafers of sets A and B were analyzed for minority carrier diffusion length by Elymat. The results were 900 microns for set A and 450 microns for set B.

As will be appreciated from the foregoing description, the above-described metal decontamination problem of using an ozonated ambient to grow a hydrophilic oxide layer on a silicon wafer is obviated in accordance with the present invention by using an SC-2 bath containing hydrogen peroxide and a dilute concentration of metal-scouring HCl. The presence of the HCl in the SC-2 bath serves to mitigate metallic contamination during the chemical oxide growth caused by the $H_2O_2$ in the SC-2 bath. The SC-2 medium in which the oxide is grown is not itself a source of metallic contaminants. As a consequence the hydrophilic silicon oxide layer grown on the surface of the silicon wafer using the combined SC-1→HF/HCL→SC-2 wafer cleaning process of the invention enjoys a substantially improvement in diffusion length of minority carriers (from a range on the order of 500–600 microns to a range on the order of 800–900 microns).

While we have shown and described an embodiment in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed:

1. A method for processing a silicon wafer subjected to thermal processing that may cause contaminant metals present on the surface of the wafer to be driven into the silicon wafer and degrade bulk silicon minority carrier recombination lifetime, said method comprising the steps of:

(a) contacting said wafer with a pre-clean SC-1 aqueous cleaning solution, so as to remove organic contaminants and particulates, and form soluble complexes of said contaminant metals;

(b) contacting the surface of the silicon wafer processed in step (a) with an aqueous solution containing hydrofluoric acid and hydrochloric acid to remove contaminant metallic-containing oxides from the wafer surface leaving said surface of said silicon wafer oxide-free; and (c) contacting the hydrofluoric and hydrochloric acid treated, oxide-free surface of said silicon wafer processed in step (b) with an ozone-free aqueous SC-2 solution containing peroxide and hydrochloric acid to grow a hydrophilic oxide layer on the oxide-free surface of the silicon wafer.

2. A method according to claim 1, further including the step of:

(d) heating the wafer processed in step (c) to a temperature of at least about 300° C. for a duration of at least about one second.

3. A method for heat-treating a silicon wafer comprising the steps of:

(a) contacting the surface of the silicon wafer with an aqueous solution containing hydrofluoric acid and hydrochloric acid to remove metals from the wafer surface and leave said wafer surface oxide-free;

(b) contacting the hydrofluoric and hydrochloric acid treated, oxide-free surface of said silicon wafer processed in step (a) with an ozone-free aqueous solution containing peroxide and hydrochloric acid to grow a hydrophilic oxide layer on the oxide-free surface of the silicon wafer, with the concentration of each of iron, chromium, calcium, titanium, cobalt, manganese, zinc, and vanadium on the surface of the silicon wafer being less than $1 \times 10^9$ atoms/$cm^2$; and (c) heating the wafer processed in step (b) to a temperature of at least about 300° C. for a duration of at least about one second.

* * * * *